United States Patent [19]

Ishii

[11] Patent Number: 5,683,537
[45] Date of Patent: Nov. 4, 1997

[54] PLASMA PROCESSING APPARATUS

[75] Inventor: Nobuo Ishii, Yamanashi-ken, Japan

[73] Assignee: Tokyo Electron Limited, Tokyo, Japan

[21] Appl. No.: 317,752

[22] Filed: Oct. 4, 1994

[30] Foreign Application Priority Data

Oct. 4, 1993 [JP] Japan ................... 5-273141
Oct. 4, 1993 [JP] Japan ................... 5-273142

[51] Int. Cl.$^6$ ............................................. H05H 1/00
[52] U.S. Cl. .............. 156/345; 118/723 I; 204/298.06; 204/298.07; 204/298.33; 204/298.34
[58] Field of Search ................. 156/345; 118/723 I, 118/723 IR; 204/298.07, 298.09, 298.08, 298.06, 298.34, 298.33

[56] References Cited

U.S. PATENT DOCUMENTS

| | | | |
|---|---|---|---|
| 4,844,775 | 7/1989 | Keeble | 156/345 X |
| 4,948,458 | 8/1990 | Ogle | 156/345 X |
| 5,277,751 | 1/1994 | Ogle | 156/345 X |
| 5,279,669 | 1/1994 | Lee | 156/345 X |

FOREIGN PATENT DOCUMENTS

0 379 828   1/1990   European Pat. Off..
3-79025     4/1991   Japan.

*Primary Examiner*—Thi Dang
*Attorney, Agent, or Firm*—Oblon, Spivak, McClelland, Maier & Neustadt, P.C.

[57] ABSTRACT

A plasma processing apparatus includes an air-tight chamber consisting of a conductive material, which is grounded, a susceptor provided in the air-tight chamber, for supporting a wafer to be processed, and an RF antenna constituted by a flat coil which is provided in the air-tight chamber to oppose, at a predetermined gap, the wafer which is mounted on the susceptor. A process gas is supplied into the chamber, and an RF power is applied to the RF antenna to generate a plasma between the antenna and the wafer, thereby processing the wafer with the plasma.

16 Claims, 7 Drawing Sheets

PLASMA PROCESSING APPARATUS

BACKGROUND OF THE INVENTION

1. Field of the Invention

The present invention relates to a plasma processing apparatus employing the RF induction method.

2. Description of the Related Art

In semiconductor wafer processing steps, dry etching is performed for, e.g., isolation of capacitors and elements and formation of contact holes. A parallel plate type plasma processing apparatus is known as a representative of conventional apparatuses that perform dry etching.

In this conventional apparatus, a rest table serving also as a lower electrode is disposed in an air-tight chamber into which a process gas is supplied, and an upper electrode serving also as a gas supply section is disposed above the rest table to oppose it.

In this plasma processing apparatus, first, a wafer is placed on the rest table, and a process gas is supplied from the gas supply section. Simultaneously, an RF power is applied across the two electrodes by an RF power supply in order to generate a plasma, thereby etching the wafer by reactive ions in the plasma.

The line width of patterns of a device is more and more decreasing. When a plasma is generated in the above apparatus, the pressure in the chamber is 100 mTorr to 1 Torr. Under this high pressure, since the mean free time of ions is short, micropatterning is difficult to perform. Also, the diameters of wafers are increasing. When the mean free time of ions is short, a high uniformity of the plasma distribution over a wide surface cannot be ensured, and thus it is difficult to uniformly process a wafer having a large diameter.

For this reason, recently, employment of the RF induction method has been studied. According to this method, as described in European Pat. Appln. KOKAI Publication No. 379828 and Jpn. Pat. Appln. KOKAI Publication No. 3-79025, the upper wall portion of a chamber opposing a rest table is constituted by an insulating member, e.g., a quartz glass member, and a flat coil is mounted on the outer surface of the insulating member. An RF current is supplied to this coil to form an electromagnetic field in the chamber. The electrons flowing in the electromagnetic field are caused to collide against neutral particles in the process gas, thereby generating a plasma.

According to this method, a substantially concentric electric field is induced in accordance with the shape of the coil, thereby providing a plasma confining effect. When compared to the conventional parallel plate type plasma processing apparatus, the plasma can be generated with a comparatively low pressure. Accordingly, the mean free time of ions in the generated plasma is long. Therefore, etching by means of this plasma is suitable for micropatterning. The plasma is diffused from a high-density area to a low-density area. Since the mean free time of ions is long, the plasma density distribution is smooth. Thus, the uniformity of the plasma on a plane parallel to the flat surface of the wafer is high, thereby increasing the uniformity within a plane of plasma processing for a wafer having a large diameter.

In this manner, an RF induction method attracts attention as a method suitable for micropatterning and processing of wafers with large diameters. However, to put the RF induction method into practical use, various problems must be solved. For example, one problem is as follows. Since the RF antenna is provided outside the chamber, if a large power is applied to the antenna, electromagnetic interference is caused around the antenna. Thus, the RF antenna must be covered with a shield, leading to a large-sized, complicated apparatus. When the upper wall of the chamber is made of quartz and the RF antenna is placed on the upper wall of the chamber, as the quartz has a small thermal conductivity, a portion of the chamber in contact with the antenna is locally heated upon application of power. Then, a large thermal stress is generated in quartz to cause cracking, leading to explosion of the chamber.

SUMMARY OF THE INVENTION

It is an object of the present invention to provide an entirely down-sized plasma processing apparatus for processing an object to be processed with a plasma obtained by applying an RF power to an RF antenna comprising a coil.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
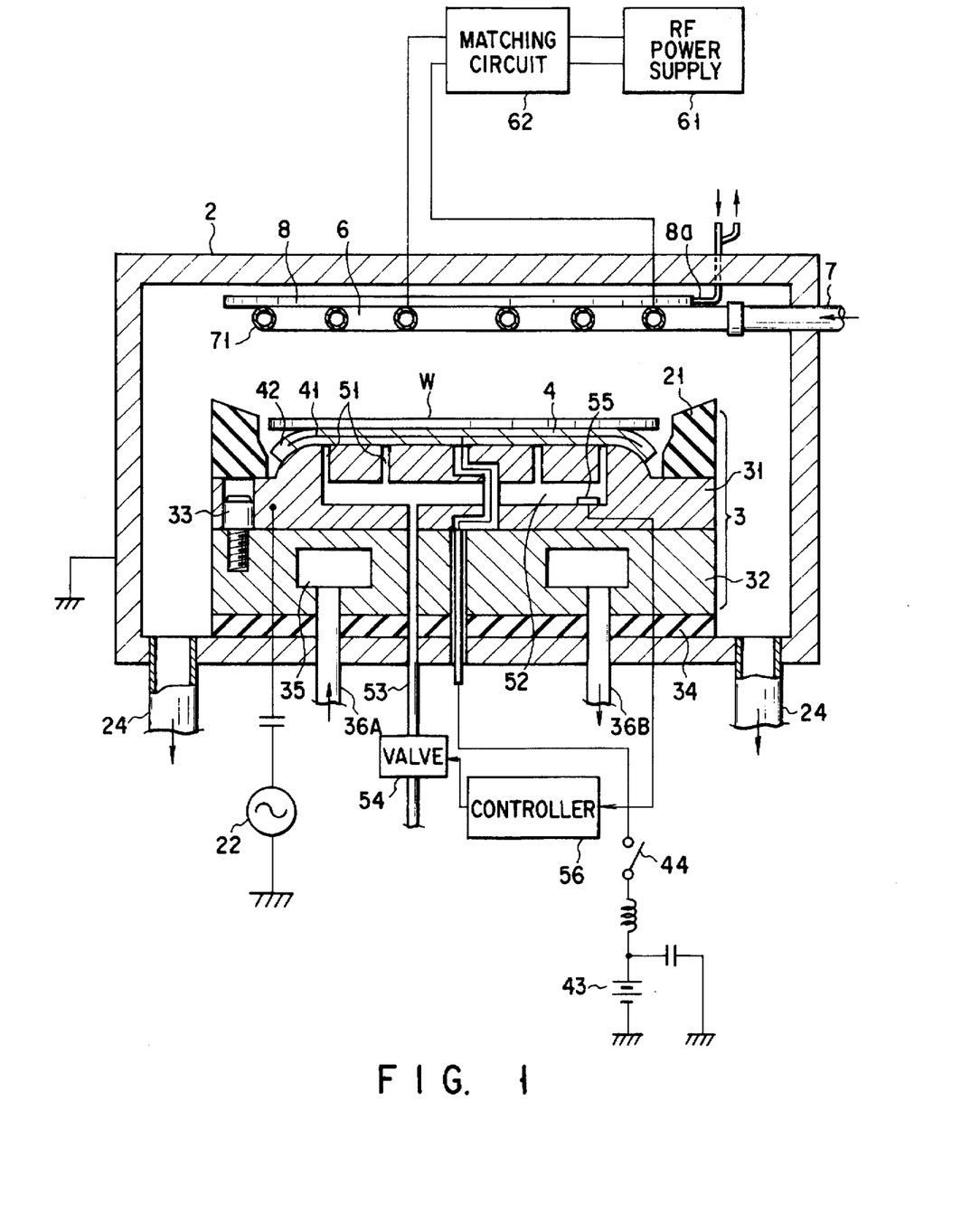
FIG. 1 is a sectional view showing the overall arrangement of a plasma processing apparatus according to the first embodiment of the present invention.
Figure 2:
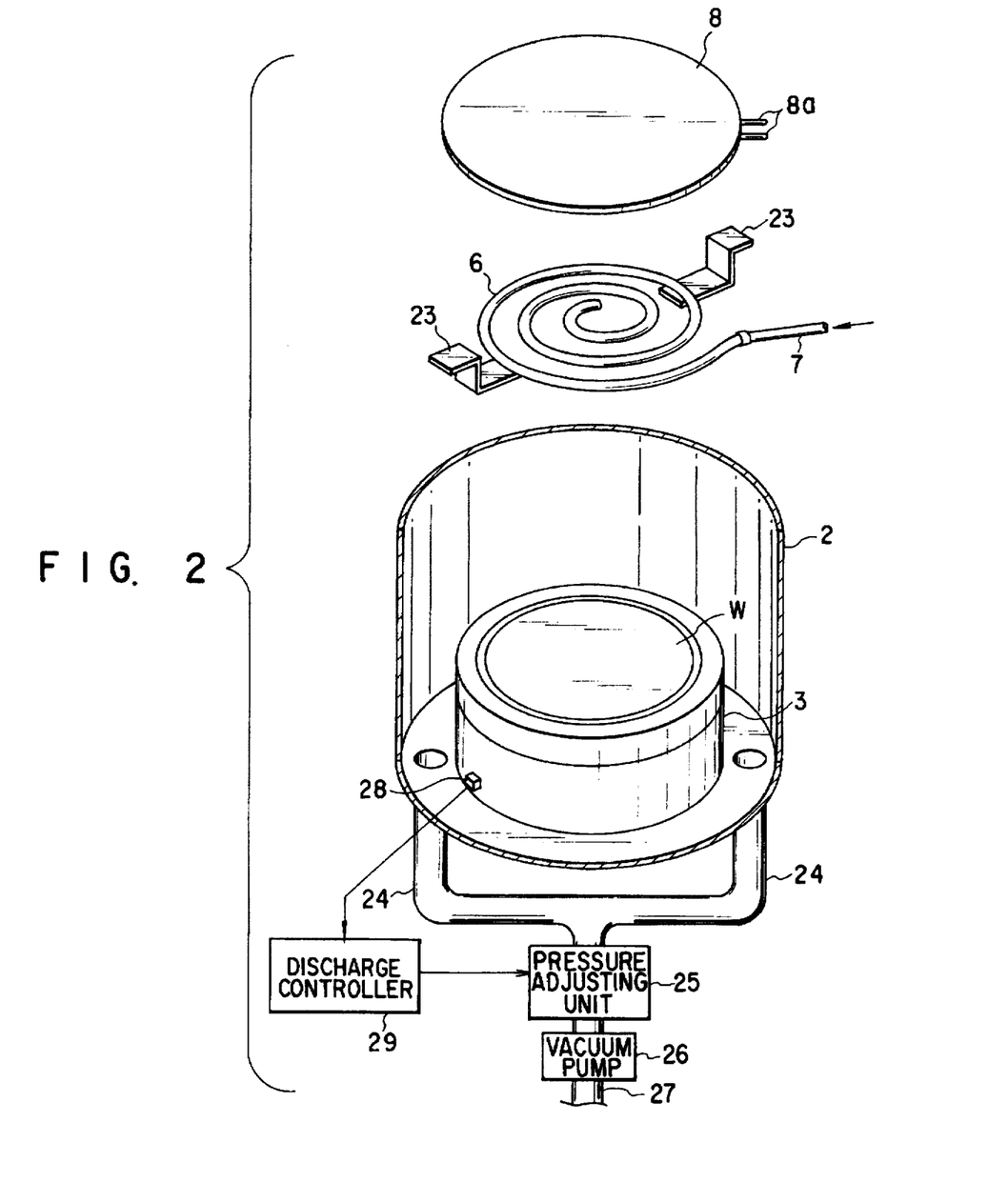
FIG. 2 is a schematic exploded perspective view showing the outline of the overall arrangement of the plasma processing apparatus shown in FIG. 1.

FIG. 1 is a sectional view showing the overall arrangement of a plasma processing apparatus according to an embodiment of the present invention, e.g., an etching apparatus, and FIG. 2 is a partially cutaway schematic exploded perspective view of the same. Referring to FIGS. 1 and 2, reference numeral 2 denotes a cylindrical or rectangular air-tight chamber which is grounded and partly or entirely constituted by a conductive material, e.g., aluminum. A semiconductor wafer W serving as an object to be processed is loaded into and unloaded from this chamber through gate valves (not shown). A rest table or susceptor 3 made of a conductive material, e.g., aluminum, is arranged at the central bottom portion in the chamber 2.

The rest table 3 is constituted by separably coupling, with a bolt or bolts 33, a rest section 31 as an upper portion and a support section 32 as a lower portion that supports the rest section 31. An insulator 34 is interposed between the support section 32 and the bottom wall of the chamber 2 in order to electrically separate the support section 32 and the chamber 2 from each other. An electrostatic chuck sheet 4 is provided on the upper surface of the rest section 31 to cover the upper surface of the rest section 31 excluding its peripheral portion. The electrostatic chuck sheet 4 is constituted by covering a conductive film 41 serving as an electrostatic chuck sheet electrode made of, e.g., a copper foil, from the two sides with insulating films 42 made of, e.g., polyimide films. The conductive film 41 is electrically connected to a DC power supply 43 outside the chamber 2 through a switch 44.

Hole portions or through holes 51 for a plurality of back-side gases (gases for heat conduction) are formed in the rest section 31 such that their upper ends are open in the upper surface of the rest section 31. The lower ends of the hole portions 51 communicate with a gas supply path 53 for the back-side gases through a vent chamber 52 formed in the rest section 31. vertical through holes (not shown) are formed in the electrostatic chuck sheet 4 at positions corresponding to the respective hole portions 51. The back-side gases sent from the hole portions 51 are supplied to a portion above the electrostatic chuck sheet 4 through the holes in the electrostatic chuck sheet 4 and are blown against the lower surface of a wafer W which is chucked on the electrostatic chuck sheet 4. The gas supply path 53 is connected to a gas supply source (not shown), e.g., a He gas source, through a pressure adjusting unit 54, e.g., a butterfly valve.

The vent chamber 52 is provided with a pressure detector 55 for detecting the pressure of the back-side gases. A controller 56 included in the control system of the apparatus of the present invention adjusts the opening degree of the pressure adjusting unit 54, e.g., the butterfly valve, based on the pressure detected by the pressure detector 55, such that the pressure of the back-side gases blown from the hole portions 51 toward the lower surface of the wafer W is maintained at a predetermined value, e.g., 10 Torr.

An annular focus ring 21 is disposed on the peripheral portion of the rest section 31 to surround the wafer W. The focus ring 21 is made of an insulating material that does not attract reactive ions, so that the reactive ions are effectively attracted by the wafer W inside the focus ring 21.

An annular coolant reservoir 35 is formed in the support section 32 in order to circulate a coolant, thereby cooling the wafer W through the rest table 3. The coolant reservoir 35 is provided with an inlet pipe 36A and a discharge pipe 36B both extending to the outside of the chamber. The coolant, e.g., liquid nitrogen, supplied into the coolant reservoir 35 through the inlet pipe 36A is discharged to outside the apparatus through the discharge pipe 36B.

In the vicinity of the inner surface of the upper wall of the chamber 2, an RF antenna 6 made of a flat coil, e.g., a spiral coil or a plurality of concentric rings, is fixed to the chamber 2 with a fixing member 23 (see FIG. 2) made of an insulator, e.g., a fluorine plastic, such that it opposes the rest table 3. The RF antenna 6 is made of a conductive material, e.g., aluminum, and is constituted by a tubular body having an open outer end and a closed inner end. A process gas guide space or guide path is defined in the tubular body to extend along it. The outer and inner circumferential surfaces of the tubular body are covered with protection layers (indicated by reference numeral 20 in the second embodiment to be described later) which are made of an anti-corrosion material, e.g., aluminum oxide, in order to prevent corrosion caused by the process gas.

Figure 3:
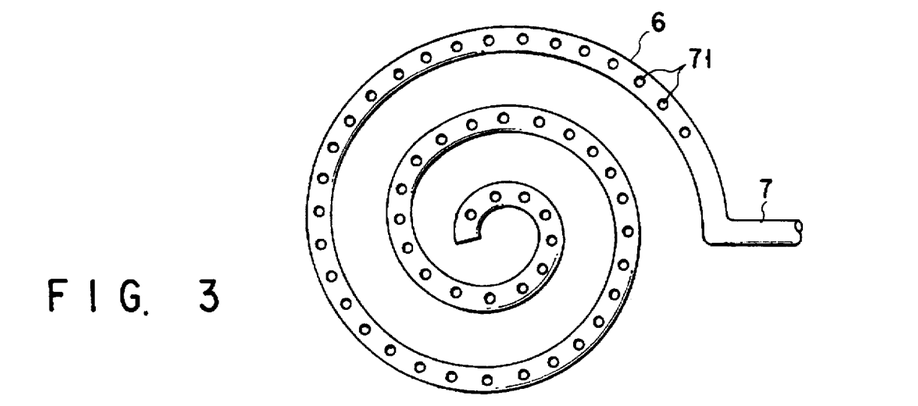
FIG. 3 is a bottom view showing an RF antenna used in the plasma processing apparatus.

One end of a gas supply pipe 7 is connected to the open outer end of the RF antenna 6 to supply the process gas into the RF antenna 6, i.e., the tubular process gas guide space. The other end of the gas supply pipe 7 extends to the outside of the chamber, while maintaining insulation from the chamber, and is connected to a supply source (not shown) for supplying the process gas, e.g., $CHF_3$ or $CF_4$, in the case of etching. As shown in FIG. 3, process gas outlet ports, e.g., gas blow-off holes 71, for communicating the internal space and the outside (the space in the chamber 2) of the tubular body with each other are formed in the lower surface of the RF antenna 6 along the coil. The arrangement, number, and size of these blow-off holes 71 are appropriately set such that the process gas blown off into the chamber through them has a uniform density distribution on the wafer W.

An RF voltage of, e.g., 13.56 MHz and 1 kW, is applied across the two terminals (inner and outer terminals) of the RF antenna 6 from a plasma-generating RF power supply 61 through a matching circuit 62. Thus, an RF current flows through the RF antenna 6, and a plasma is generated in the space immediately under the antenna 6, as will be described later.

A cooling means, e.g., a cooling plate 8, for cooling the RF antenna 6 is provided on the upper surface of the RF antenna 6. The cooling plate 8 is constituted such that a coolant, e.g., cooling water, flows in it through, e.g., a coolant pipe 8a. When the RF antenna 6 is cooled in this manner, separation of the anti-corrosion material which is caused by a difference in thermal expansion coefficient between the material of the antenna and the anti-corrosion material on the outer and/or inner circumferential surface of the antenna, can be suppressed.

An RF power supply 22 is connected between the rest table 3 and ground in order to apply to the rest table 3 a bias voltage having a frequency lower than the frequency of the RF voltage to be supplied to the RF antenna 6, e.g., 400 kHz. The chamber 2 is connected to ground and maintained at a zero potential. Thus, an electric field is generated between the rest table 3 and the chamber 2. As a result, the perpendicularity of incidence of reactive ions in the plasma in the chamber 2 with respect to the wafer W is increased.

One end of each of a plurality of discharge pipes 24 is connected to the bottom surface of the chamber 2 at such a position that the discharge pipes 24 are equidistant in the circumferential direction of the chamber 2. In FIG. 1, one end of each of two discharge pipes 24 is connected such that the two discharge pipes 24 are symmetrical with respect to the axis of the chamber 2. The other end of each discharge pipe 24 is connected to a common discharge pipe 27 provided with a pressure adjusting unit 25, e.g., a butterfly valve, and a vacuum pump 26, as shown in FIG. 2. In this embodiment, a discharge controller 29 adjusts the pressure adjusting unit 25 based on a detected pressure value obtained by a pressure detector 28 provided in the chamber 2, so that the discharge system slowly performs discharge in the initial state of evacuation so as not to scatter particles, and performs rapid discharge after evacuation is performed to a certain degree.

The operation of this embodiment will be described. First, an object to be processed, e.g., a wafer W, is loaded into the chamber 2 and placed on the electrostatic chuck sheet 4 by a convey arm (not shown). The interior of the chamber 2 is evacuated by the vacuum pump 26 through the discharge pipes 24 to a predetermined vacuum atmosphere, and is evacuated through the discharge pipes 24, while supplying an etching gas, e.g., $CF_4$, by the gas supply pipe 7 from the blow-off holes 71 into the chamber 2 through the internal space of the RF antenna 6, in order to maintain the interior of the chamber 2 at a vacuum degree of, e.g., several mTorr to several tens of mTorr. Simultaneously, an RF voltage is applied to the RF antenna 6 by the RF power supply 61. When an RF current flows through the RF antenna 6 upon application of the RF voltage, an alternating magnetic field is generated around the antenna conductor, and most of the magnetic fluxes run through the central portion of the RF antenna 6 in the vertical direction, thereby forming a closed loop. By this alternating magnetic field, an alternating electric field is induced immediately under the RF antenna 6 almost concentrically in the circumferential direction. The electrons accelerated by the alternating electric field in the circumferential direction collide against the neutral particles in the process gas to ionize the gas, thereby generating a plasma. The reactive ions in the plasma generated in this manner etch the surface of the wafer W or an insulating or conductive layer formed thereon.

When the RF power is applied to the RF antenna 6 in this manner, a radio wave is apt to spread around the RF antenna 6. However, since the chamber 2 is made of aluminum and grounded, the radio wave is shielded by the chamber 2, thereby preventing electromagnetic interference around the apparatus. Since the RF antenna 6 does not exist outside the chamber 2, the apparatus can be down-sized accordingly. The especially advantageous point is as follows. If the RF antenna is provided outside the chamber 2 and a shield body is to be arranged outside the chamber, the outer wall of the chamber 2 must be subjected to processing for providing the shield body. However, if the chamber 2 serves as a shield body, such processing becomes unnecessary. Since the shield body is not arranged outside the chamber 2, down-sizing and simplification of the apparatus can be achieved.

Since the RF antenna also serves as the process gas supply section, the arrangement becomes simpler when compared to a case wherein a process gas supply section is separately provided to the RF antenna, e.g., around the RF antenna. When the process gas blow-off holes 71 are formed along the coil, they overlap the projected image of the wafer W on the rest table 3. Since the blow-off holes 71 are arranged annularly, the process gas can be supplied to the surface of the wafer W with a high uniformity, thereby performing uniform plasma processing. Note that the gas outlet ports need not be holes but may be one or a plurality of slits extending along the antenna. Since the RF antenna 6 is cooled from inside by the flow of the process gas, separation of the anti-corrosion material formed on the inner and outer circumferential surfaces of the RF antenna 6 can be prevented by this cooling effect.

Modifications of this embodiment will be described with reference to FIGS. 4 and 5. Note that in these modifications and other embodiments to be described later, members that are substantially identical to those of the above embodiment are denoted by the same reference numerals, and a detailed description thereof will be omitted.

Figure 4:
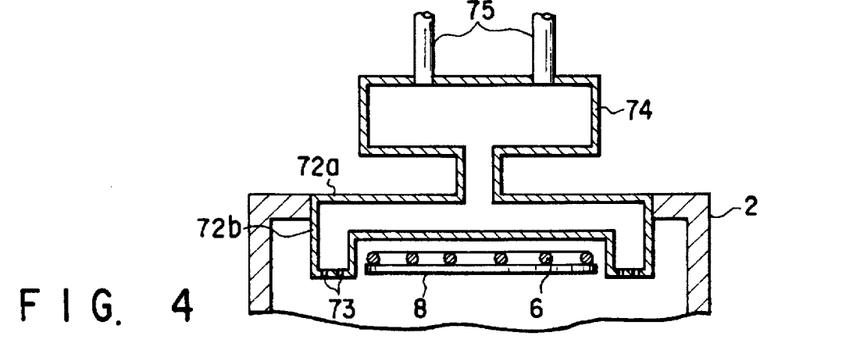
FIG. 4 is a sectional view showing part of a modification of the first embodiment.

In the modification shown in FIG. 4, an annular projecting wall 72b is formed on the periphery of the lower surface of a cylindrical portion 72a fitted in the center of the upper wall of a chamber 2. The internal space defined by the annular projecting wall 72b and the cylindrical portion 72a serves as the gas guide chamber. A plurality of process gas blow-off holes 73 are formed in the lower end wall of the annular projecting wall 72b in the circumferential direction to oppose the wafer at a predetermined gap. A process gas supply section is thus constituted. This process gas supply section communicates with a gas mixing chamber 74 provided outside the chamber 2, and a plurality of gas supply pipes 75 (two pipes are shown in FIG. 4) are connected to the gas mixing chamber 74. Inside the annular projecting wall 72b and under the cylindrical portion 72a, an RF antenna 6 is disposed such that it is placed on a cooling plate 8 supported by the cylindrical portion 72a. In this arrangement, since a plurality of types of process gases supplied from the pipes 75 are mixed in the gas mixing chamber 74 and the mixed gas is supplied into the chamber through the gas guide chamber, a process gas having a uniform composition can be supplied to the surface of a wafer W. As the material of the process gas supply section, e.g., alumina-based ceramic or SiC can be suitably used. Alumina-based ceramic is not easily etched by halogen gases. Regarding SiC, when it is employed as the material of the process gas supply section, even if the gas supplying portion is etched, since SiC is a silicon-based component, it does not adversely affect the wafer.

Figure 5:
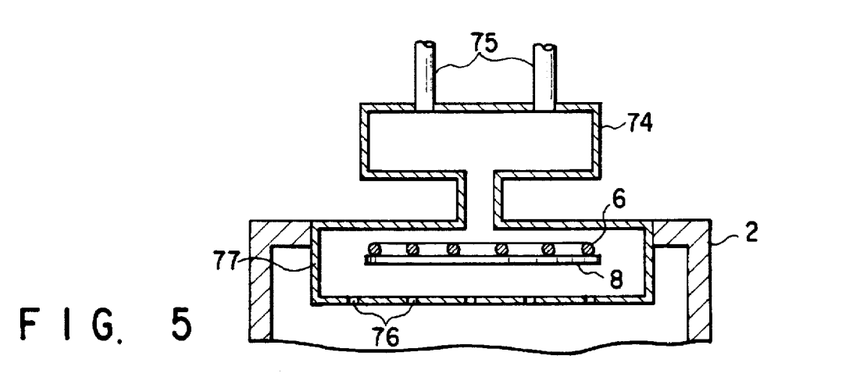
FIG. 5 is a sectional view showing part of another modification of the first embodiment.
Figure 6:
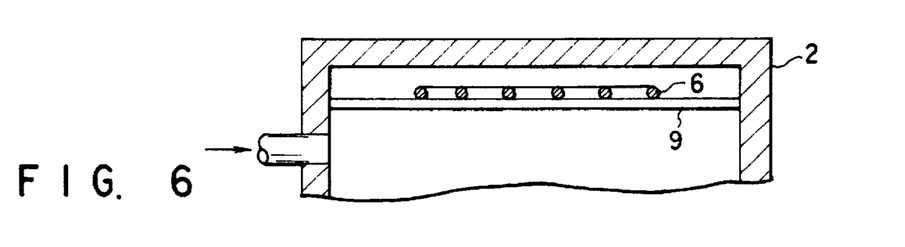
FIG. 6 is a sectional view showing part of still another modification of the first embodiment.

In the modification shown in FIG. 5, a process gas supply section is constituted by a cylindrical body 77 having a large number of gas blow-off holes 76 in its lower wall with a predetermined distribution. An RF antenna 6 is provided in the cylindrical body 77. The apparatus shown in FIGS. 4 and 5, use the cooling plate 8 for cooling the RF antenna 6. However, the cooling plate 8 is not always necessary. When providing an RF antenna in the chamber, the RF antenna may be housed in a container made of an insulating, anti-corrosion material. Alternatively, as shown in FIG. 6, the space in the chamber 2 near its upper surface may be partitioned with a partition plate 9 made of, e.g., ceramics, and an RF antenna 6 may be placed on the partitioning plate 9.

Figure 7:
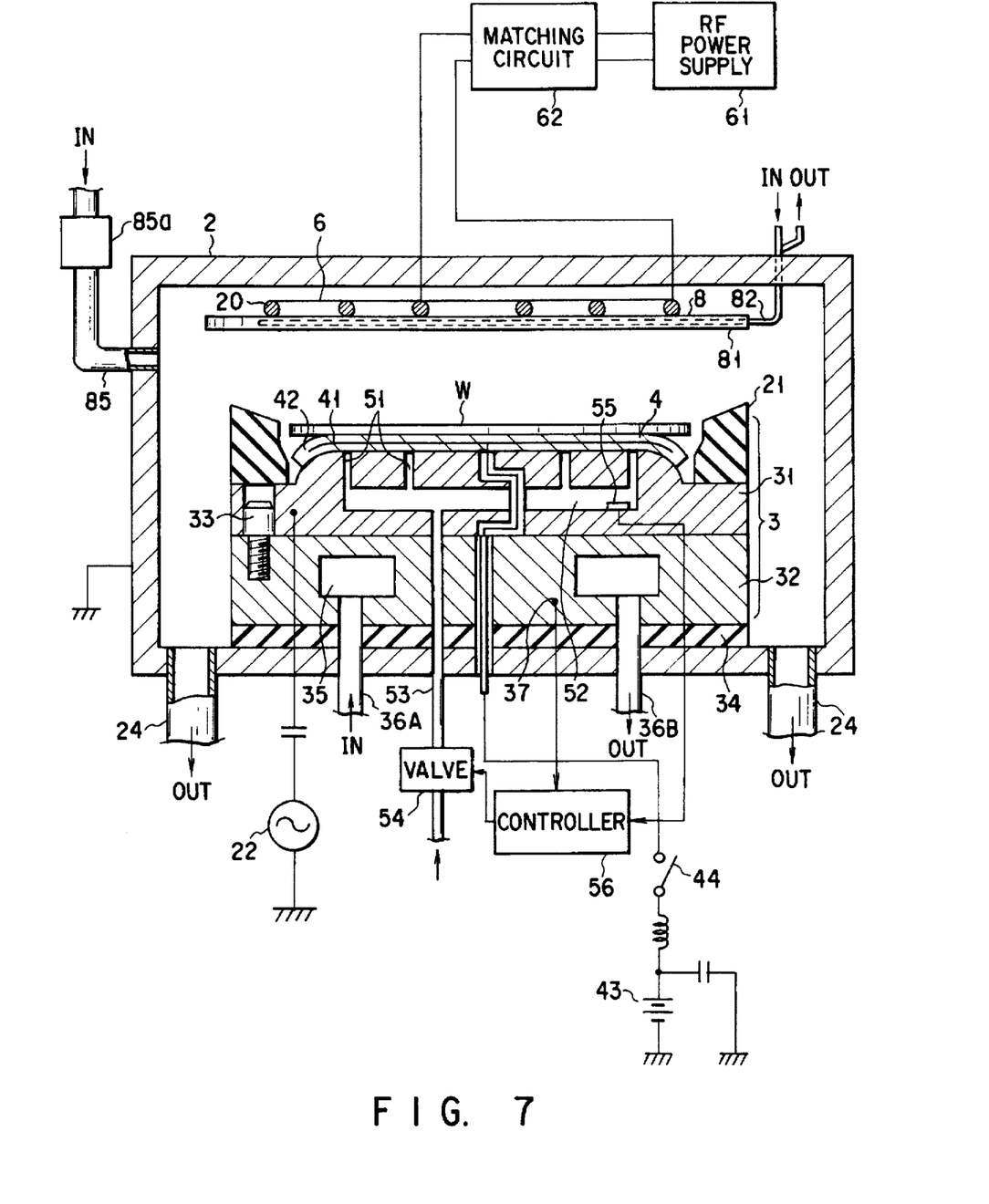
FIG. 7 is a sectional view showing the overall arrangement of the second embodiment of the present invention.
Figure 8:
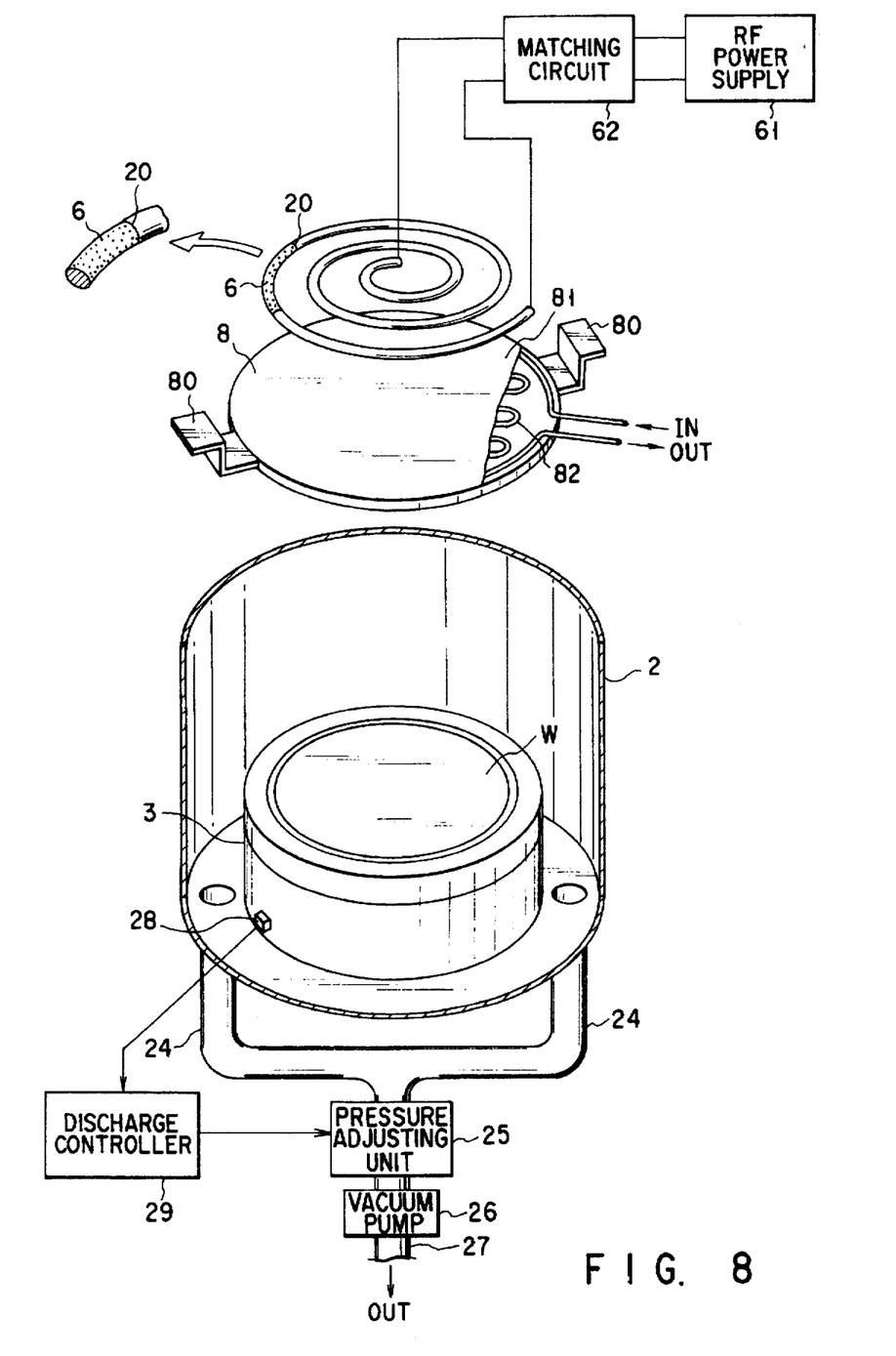
FIG. 8 is a schematic exploded perspective view showing the outline of the overall arrangement of the embodiment shown in FIG. 7.

Another embodiment will be described with reference to FIGS. 7 and 8.

In this second embodiment, an RF antenna 6 does not have a process gas supplying function. A cooling means, e.g., a cooling plate 8, for supporting and cooling the RF antenna 6 is provided on the lower surface of the antenna 6 to be in contact with the antenna 6. As shown in FIG. 8, the cooling plate 8 is constituted by a hollow plate body 81 and a coolant pipe 82. The plate body 81 is mounted to a chamber 2 through a mounting member 80 and is made of an insulator, e.g., ceramic. The coolant pipe 82 is provided in the plate body 81 and is made of an insulator, e.g., a plastic. A coolant fluid constituted by cooling water, e.g., pure water, is supplied to the coolant pipe 82 from outside the chamber 2.

A gas supply pipe 85 having a temperature adjusting means 85a for adjusting the process gas to a predetermined temperature, constituted by combining a heating means and a cooling means, is connected to the upper portion of the side surface of the chamber 2. A process gas to be supplied into the chamber 2 through the gas supply pipe 85 differs depending on the types of processing. For example, when etching is to be performed, an etching gas, e.g., $CHF_3$ or $CF_4$, is supplied. In FIG. 7, only one gas supply pipe 85 is shown. However, an appropriate number of gas supply pipes may be connected to the chamber 2 in order to uniformly supply a process gas.

In this plasma processing apparatus according the second embodiment, a plasma is generated in the chamber in the same manner as in the first embodiment, thereby etching the wafer.

During etching, the RF antenna 6 generates heat upon application of an RF power. The generated heat is absorbed by the cooling plate 8 which is in contact with the RF antenna 6. As a result, an increase in temperature of the RF antenna 6 is suppressed. The RF antenna 6 and a protection layer 20, e.g., an aluminum oxide layer, formed on the inner and/or outer circumferential surface of the RF antenna 6 have different thermal expansion coefficients. However, since the temperature of the RF antenna 6 is not increased very high, the thermal stress caused on the interface between the RF antenna 6 and the protection layer 20 is small. Therefore, cracking and separation of the protection layer can be prevented, thereby preventing generation of particles caused by providing the RF antenna 6 in the chamber 2.

Figure 9:
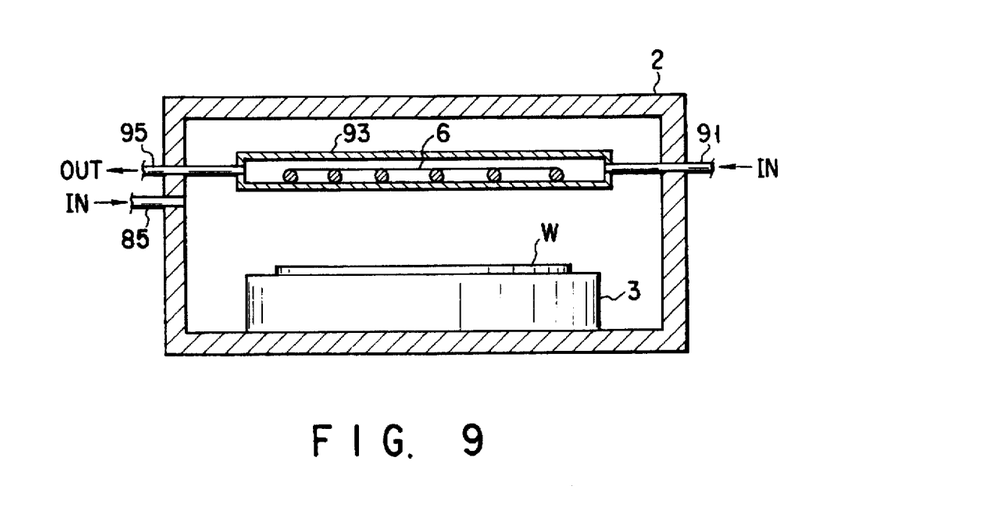
FIG. 9 is a schematic sectional view showing a modification of the second embodiment.

In the second embodiment described above, the cooling means of the RF antenna is not limited to the cooling plate. For example, as shown in FIG. 9, a cooling means may be constituted by housing an RF antenna 6 in an air-tight container 93 made of an anti-corrosion insulator, e.g., ceramic. A coolant gas, e.g., an inert gas flows, into the container 93 through a coolant inlet pipe 91 and discharged from a coolant discharge pipe 95.

Figure 10:
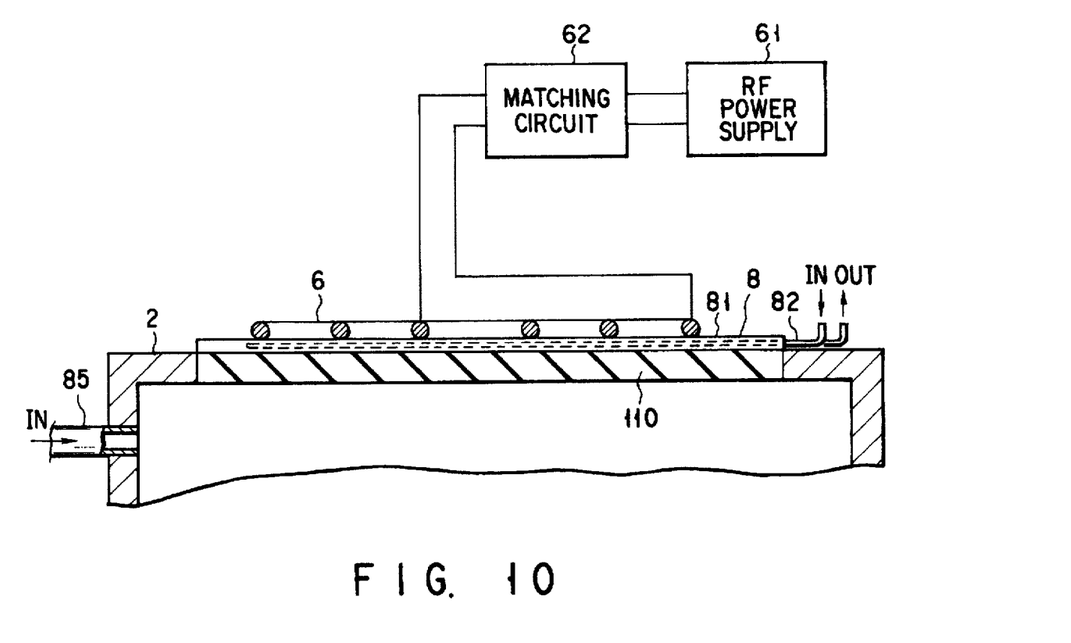
FIG. 10 is a sectional view showing part of another modification of the second embodiment.

If the RF antenna 6 is provided in the chamber 2, as described above, when compared to a case wherein the RF antenna 6 is provided outside the chamber, it is advantageous in that the chamber 2 can also serve as a shield body of the RF antenna 6. In the second embodiment, as shown in FIG. 10, the upper surface of the chamber 2 may be constituted by an insulator 110, e.g., quartz, over a range wider than the area opposing, e.g., a rest table 3, a cooling plate 8 identical to that described above may be placed on the insulator 110, and an RF antenna 6 may be placed on the cooling plate 8. In this case, since, e.g., quartz, has a small thermal conductivity, if a large temperature distribution is formed in the early stage of heat generation by the RF antenna 6, cracking may undesirably occur. However, since the cooling plate 8 is interposed between the RF antenna 6 and the upper surface of the chamber 2, a temperature increase in a surface opposite to the chamber 2 is suppressed. As a result, cracking of the insulator, e.g., quartz, can be prevented, thereby preventing explosion of the chamber 2.

Figure 11:
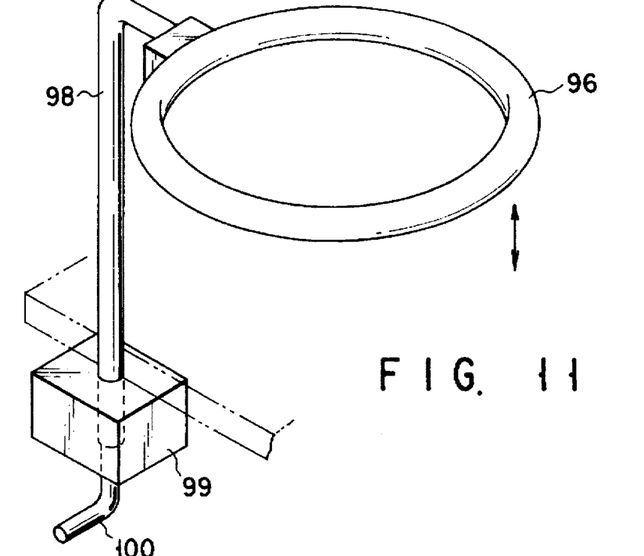
FIG. 11 is a perspective view showing the arrangement of a process gas supplying means of the second embodiment.
Figure 12:
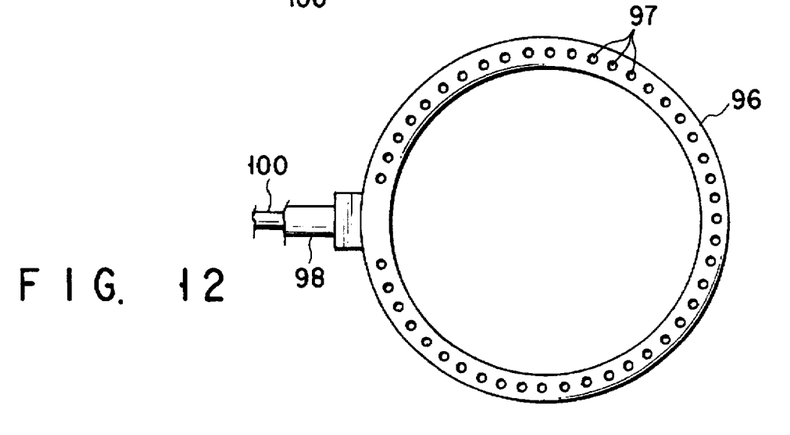
FIG. 12 is a bottom view of a gas supplying ring shown in FIG. 11.

An arrangement of a process gas supplying means in the apparatus according to the second embodiment will be described with reference to FIGS. 11 and 12. Referring to FIGS. 11 and 12, reference numeral 96 denotes a ring having an inner diameter slightly larger than the outer diameter of, e.g., the RF antenna 6. The ring 96 is constituted by a tubular body, and a large number of gas blow-off holes 97 are formed in the circumferential direction in the lower surface of the ring 96. The upper end of an L-shaped support pipe 98 is coupled to the ring 96. The lower end of the support pipe 98 projects to the outside of the chamber 2 through the bottom wall of the chamber 2. Thus, the ring 96 can be vertically moved by an elevating mechanism 99 outside the chamber 2. A process gas supply pipe 100 is inserted in the support pipe 98. The inner end of the gas supply pipe 100 opens in the internal space of the ring 96. Accordingly, a process gas blows off from the gas blow-off holes 97 in the ring 96. With this arrangement, the in-plane uniformity of the gas flow on the surface of the wafer can be increased, and the height of the ring 96 can be changed, so that gas flow on the surface of the wafer W can be adjusted. In order to rapidly discharge reaction products formed by etching, gas blow-off holes and gas discharge holes may be alternately formed in the ring 96.

Figure 13:
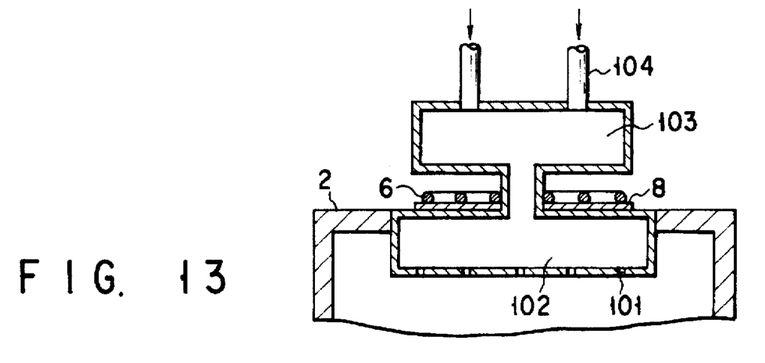
FIG. 13 is a sectional view showing still another embodiment of the second embodiment.

As a means for supplying the process gas, as shown in FIG. 13, a cylindrical gas supply chamber 102 having gas blow-off holes 101 in its lower surface may be provided in the upper portion of a chamber 2, a gas mixing chamber 103 may be provided to communicate with the gas supply chamber 102, and a plurality of (two in FIG. 13) gas supply pipes 104 may be connected to the gas mixing chamber 103. With this arrangement, process gases can be mixed at a high uniformity.

Plasma processing has been described above with reference to etching. However, the present invention can similarly be applied to other plasma processing apparatuses, e.g., a plasma CVD apparatus, a plasma ashing apparatus, a plasma sputtering apparatus, and the like. The object to be processed is not limited to a semiconductor wafer but can be an LCD substrate.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma processing apparatus comprising:
   an air-tight chamber at least part of which comprises an electric conductive material;
   supporting means, provided in said air-tight chamber, for supporting an object to be processed;
   means for supplying a process gas into said air-tight chamber;
   means for electrically grounding said conductive material of said air-tight chamber;
   a tubular antenna constituted by a flat coil which is provided in said air-tight chamber to oppose, at a gap, the object to be processed which is supported by said supporting means; and
   means for applying an RF power to said RF antenna in order to generate a plasma between said antenna and the object to be processed, thereby processing the object to be processed with the plasma;
   processing gas supplying means including
      a process guide path formed in said flat coil along said flat coil,
      communicating means, formed in said coil, for communicating an interior of said air-tight chamber and said process gas guide path with each other, and
      means for feeding a process gas into said process gas guide path, so that the fed process gas enters said air-tight chamber through said communicating means.

2. An apparatus according to claim 1, wherein said communicating means has a plurality of process gas outlet ports which are formed in a surface of said coil opposing the object to be processed to have a distribution along an extending direction of said coil.

3. An apparatus according to claim 1, wherein said RF antenna has outer circumferential surface coated with an anti-corrosion material, and said apparatus further comprises cooling means, provided between said antenna and said air-tight chamber, for cooling said RF antenna.

4. An apparatus according to claim 1, further comprising means for applying a voltage to said supporting means so as to generate a potential between said supporting means and said air-tight chamber.

5. An apparatus according to claim 1, further having a partition plate provided in said air-tight chamber, wherein said antenna is placed on said partition plate.

6. A plasma processing apparatus comprising:
   an air-tight chamber at least part of which comprises of an electric conductive material;
   supporting means, provided in said air-tight chamber, for supporting an object to be processed;
   means for supplying a process gas into said air-tight chamber;
   means for electrically grounding said conductive material of said air-tight chamber;
   an RF antenna constituted by a flat coil which is provided in said air-tight chamber to oppose, at a gap, the object to be processed which is supported by said supporting means; and
   means for applying an RF power to said RF antenna in order to generate a plasma between said antenna and the object to be processed, thereby processing the object to be processed with the plasma, said process gas supplying means including a tubular body, a gas mixing chamber, and a gas supply pipe, said tubular body extending through said air-tight chamber, being fixed to said air-tight chamber, defining a gas guide chamber therein, and having a large number of annularly arranged blow-off holes for communicating said guide chamber and an interior of said air-tight chamber with each other, said gas mixing chamber being arranged outside said air-tight chamber and communicating with said gas guide chamber, and said gas supply pipe supplying a process gas to said gas mixing chamber; and said antenna is mounted to said tubular body so as to be surrounded by the blow-off holes.

7. A plasma processing apparatus comprising:
   an air-tight chamber at least part of which comprises of an electric conductive material;
   supporting means, provided in said air-tight chamber, for supporting an object to be processed;
   means for supplying a process gas into said air-tight chamber;
   means for electrically grounding said conductive material of said air-tight chamber;
   an RF antenna constituted by a flat coil which is provided in said air-tight chamber to oppose, at a gap, the object to be processed which is supported by said supporting means; and
   means for applying an RF power to said RF antenna in order to generate a plasma between said antenna and the object to be processed, thereby processing the object to be processed with the plasma, said process gas supplying means including a tubular body, a gas mixing chamber, and a gas supply pipe, said tubular body extending through said air-tight chamber, being fixed to said air-tight chamber, defining a gas guide chamber therein, and having a large number of blow-off holes arranged for communicating said gas guide chamber and an interior of said air-tight chamber with each other, said gas mixing chamber being arranged outside said air-tight chamber and communicating with said gas guide chamber, and said gas supply pipe supplying a process gas to said gas mixing chamber; and said antenna is disposed in said gas guide chamber.

8. A plasma processing apparatus, comprising:
   an air-tight chamber;
   supporting means, provided in said air-tight chamber, for supporting an object to be processed;
   means for supplying a process gas into said air-tight chamber;
   an RF antenna provided in said air-tight chamber to oppose, at a gap, the object to be processed which is supported by said supporting means;
   means for applying an RF power to said RF antenna in order to generate a plasma between said antenna and the object to be processed, thereby processing the object to be processed with this plasma; and
   means for cooling said RF antenna;
   wherein said RF antenna has a flat coil and a protection layer formed on an outer circumferential surface of said flat coil and comprising an anti-corrosion material.

9. An apparatus according to claim 8, wherein said cooling means has a hollow cooling plate provided under a lower surface of said RF antenna to support and cool said RF antenna, and means for supplying a cooling fluid into said cooling plate.

10. An apparatus according to claim 9, wherein said cooling means further comprises an air-tight container, provided in said air-tight chamber, surrounding said RF antenna, consisting of an anti-corrosion material, and having a portion consisting of an insulating material and opposing said supporting means, and means for supplying said cooling fluid into said container.

11. An apparatus according to claim 9, wherein said process gas supplying means further has a tubular body, provided in said air-tight chamber to surround said RF antenna, and having a plurality of gas blow-off holes at predetermined angular intervals in a circumferential direction thereof, and a gas supply pipe, communicating with said tubular body through said air-tight chamber so as to supply a process gas into said tubular body.

12. An apparatus according to claim 11, further comprising means for moving said tubular body so as to change a distance from the object to be processed.

13. An apparatus according to claim 8, wherein said flat coil has a tubular body having an inner surface coated with an anti-corrosion material.

14. A plasma processing apparatus comprising:
   an air-tight chamber;
   supporting means, provided in said air-tight chamber, for supporting an object to be processed;
   means for supplying a process gas into said air-tight chamber;
   an RF antenna of a flat coil provided in said air-tight chamber to oppose, at a gap, the object to be processed which is supported by said supporting means; and
   means for applying an RF power to said RF antenna in order to generate a plasma between said antenna and the object to be processed, thereby processing the object to be processed with this plasma.

15. An apparatus according to claim 14, wherein said air-tight chamber has an electrically insulating wall portion which is located between the object to be processed and said RF coil, and which supports said RF coil.

16. An apparatus according to claim 15, wherein said RF antenna has a protection layer formed on an outer circumferential surface of said flat coil and comprising an anti-corrosion material.

* * * * *